United States Patent [19]
Takahashi et al.

[11] 4,245,201
[45] Jan. 13, 1981

[54] ELASTIC SURFACE WAVE DEVICE

[75] Inventors: Sadao Takahashi, Tokyo; Hitoshi Hirano, Nako; Sadao Matsumura, Inagi, all of Japan

[73] Assignee: Tokyo Shibaura Electric Co., Ltd., Kawasaki, Japan

[21] Appl. No.: 963,152

[22] Filed: Nov. 22, 1978

Related U.S. Application Data

[63] Continuation of Ser. No. 779,908, Mar. 21, 1977, abandoned.

[30] Foreign Application Priority Data

Mar. 22, 1976 [JP] Japan .................................. 51/29889

[51] Int. Cl.³ .................... H03H 9/25; H03H 9/64; H01L 41/18
[52] U.S. Cl. ............................. 333/194; 310/313 B; 333/151; 333/155; 358/905

[58] Field of Search .................. 333/150-155, 333/190-193, 193-196; 310/313, 360; 29/25.35, 594; 252/62.9; 358/188, 904, 905

[56] References Cited

U.S. PATENT DOCUMENTS 3,818,382  6/1974  Holland et al. ...................... 310/313

OTHER PUBLICATIONS

Mitchell et al.—"Surface Wave Filters" in Mullard Technical Communications, No. 108, Nov. 1970; pp. 179-181.

Primary Examiner—Marvin L. Nussbaum
Attorney, Agent, or Firm—Frishauf, Holtz, Goodman & Woodward

[57] ABSTRACT

An elastic surface wave device includes a transducer having an elastic surface wave propagated in the direction of 75 to 133 degrees to a Y-axis on an X-cut lithium tantalate ($LiTaO_3$) substrate.

7 Claims, 13 Drawing Figures

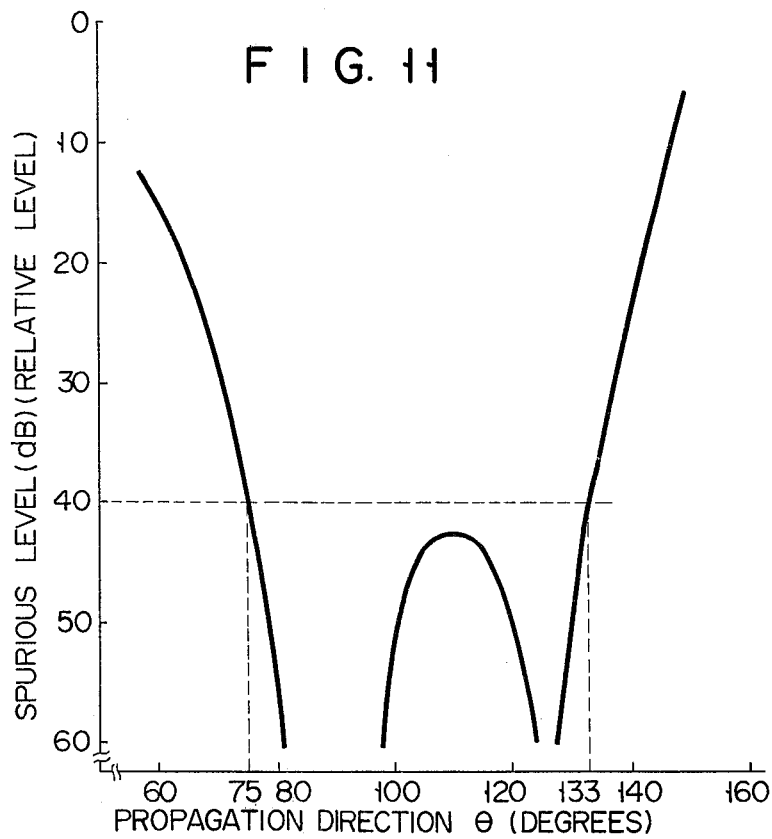
FIG. 11
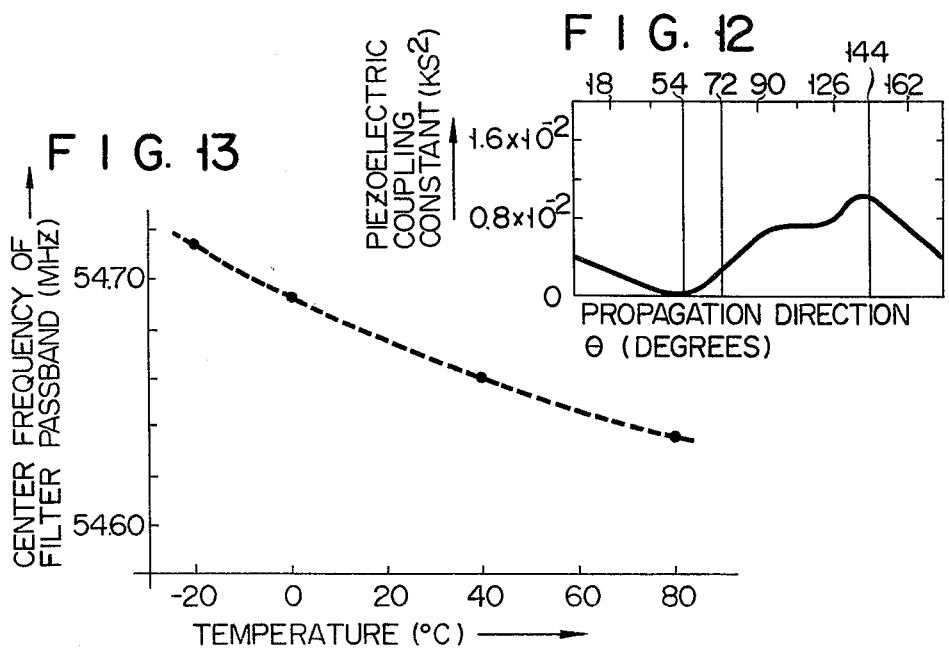
FIG. 12
FIG. 13

ELASTIC SURFACE WAVE DEVICE

This is continuation, of application Ser. No. 779,908 filed Mar. 21, 1977, now abandoned.

BACKGROUND OF THE INVENTION

This invention relates to an elastic surface wave device using an X-cut lithium tantalate (LiTaO₃) substrate.

As a substrate of an elastic surface wave device one may make use of a Y-cut Z-propagating LiNbO₃ substrate, a 130° rotated Y-cut LiNbO₃ substrate, a piezoelectric ceramic, a Y-cut Z-progagation LiTaO₃ substrate, an ST-cut quartz device, etc. based on the IRE (Institute of Radio engineering) standard.

The above-mentioned known piezoelectric devices have the following drawbacks. The Y-cut Z-propagating LiNbO₃ device has a sufficiently great piezoelectric coupling coefficient and relatively small dielectric constant and it finds general application. However, the temperature drift of the surface wave velocity has a value of about 80 PPM/C° and the temperature characteristic is greatly lowered. An interdigital electrode on the reception side receives a bulk wave and when such a LiNbO₃ device is used, for example, as a filter, a high bulk spurious response occurs at the upper area of its passband.

Although the 131° rotated Y-cut LiNbO₃ device has a better coupling coefficient, dielectric constant and bulk spurious characteristic, the temperature coefficient still has a high value of about 80 PPM/C°.

A piezoelectric ceramics device has been developed to improve the temperature characteristic. However, it has a high dielectric constant and a high variation in surface wave velocity. The Y-cut Z-propagation LiTaO₃ device has a high temperature coefficient.

The ST-cut quartz device has a better temperature coefficient, but a lower coupling coefficient.

As will be understood from the above, the abovementioned known piezoelectric bodies have various merits and demerits. An elastic surface wave device having sufficiently desirable overall characteristics has not been offered to date.

SUMMARY OF THE INVENTION

It is accordingly the object of this invention to provide an elastic surface wave device made from LiTaO₃ and having a better temperature characteristic and bulk spurious response characteristic than the known devices.

According to one embodiment of this invention, an elastic surface wave device comprises at least one transducer having an elastic surface wave propagated in a direction of 75° to 133° or (75+180)° to (133+180)° to a Y-axis on an X-cut lithium tantalate (LiTaO₃) substrate, in which a LiTaO₃ crystal is vertically X-cut at an angle of ±10° from the substrate based on the IRE standard, said Y-axis based on the IRE standard defining an axis projected on the X-cut substrate.

BRIEF DESCRIPTION OF THE DRAWING

FIG. 11 is a graph showing the relation of the surface wave propagation direction to the bulk spurious response level;

FIG. 12 is a graph showing the relation of the surface wave propagation direction to the piezoelectric coupling coefficient in the elastic surface wave device of FIG. 1; and FIG. 13 is a graph showing the relation of the temperature to the filter passband for the embodiment shown in FIG. 1.

DETAILED DESCRIPTION OF THE INVENTION

Figure 1:
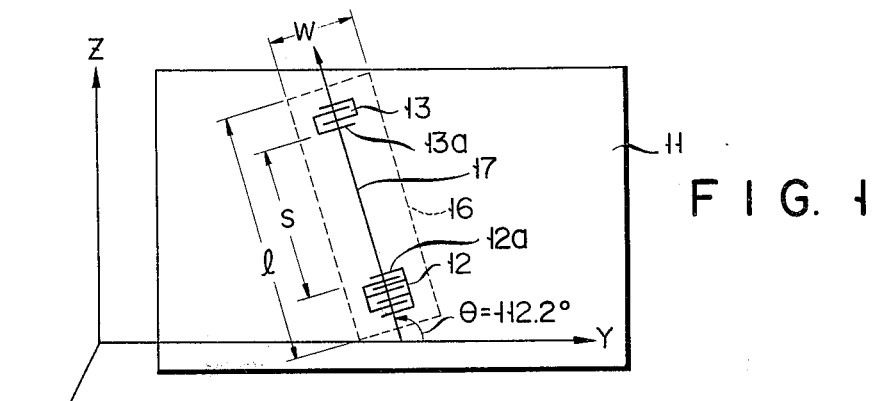
FIG. 1 is a view schematically showing an elastic surface wave device according to one embodiment of this invention.

In FIG. 1 there is shown a lithium tantalate (LiTaO₃) piezoelectric substrate 11 whose surface is cut in a direction vertical (i.e., perpendicular) to an X-axis of the LiTaO₃ crystal. A Y-axis and Z-axis are included in the surface of the substrate 11 as shown in FIG. 1. The so formed substrate is hereinafter referred to as an X-cut LiTaO₃ substrate. Each of the digit electrodes 12a and 13a of two pairs of interdigital electrodes 12,13 are located on one surface of the substrate 11 at a right angle to a straight line 17 which extends in a direction θ of 112.2° to the Y-axis so that a surface wave can be excited in a direction θ of 112.2° to the Y-axis. The interdigital electrode 12 is spaced a predetermined interval "s" away from the other interdigital electrode 13. In consequence, the piezoelectric substrate 11 can be cut along the dashed lines 16 in FIG. 1, i.e., with said straight line 17 as the longitudinal direction of the resulting cut structure. The LiTaO₃ as defined here may be in a pure form or may include, for example, 100 to 300 ppm of Al, 10 to 30 ppm of Ca, 10 ppm of Cr, 3 to 10 ppm of Cu, 10 to 30 ppm of Fe, 1000 ppm of K, 3 to 10 ppm of Mg, 10 to 30 ppm of Mn, 300 ppm of Na, 10 ppm of Nb, 10 to 30 ppm of Si, singly or in any combination as an impurity. The same effect can also be obtained if Rh, Pt, Mo, W, etc. externally added, or produced from the crucible material from the manufacturing process, are mixed singly or in combination as an impurity in the LiTaO₃. The total amount of the impurities is preferred to be of the order of below 2400 ppm. The LiTaO₃ as defined here includes the above-mentioned LiTaO₃ with such impurities.

Figure 2:
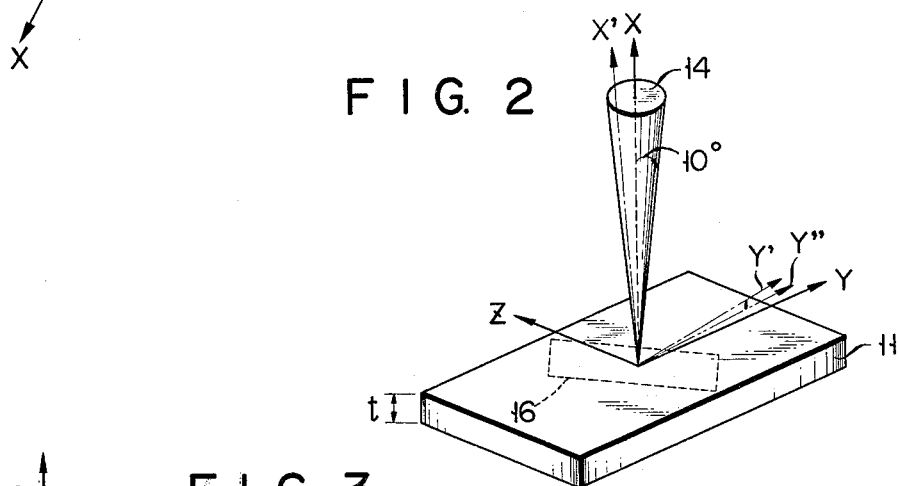
FIG. 2 is a view of the device for explaining the application range of this invention.

The "X-cut" as described herein includes all the cases where the X-axis projects vertically at an angle of 90° ±10° from the plane of the substrate cut as shown in FIG. 1 based on the IRE standard. That is, with the IRE standard axes indicated by X, Y and Z, respectively, the substrate is X-cut within a cone 14 described at an angle of ±10° to the X-axis on the XYZ coordinate, as shown in FIG. 2, with an intersection of the X-, Y- and Z-axes as a center. For the substrate 11 vertically cut with respect to the axis X' included in the cone 14, for example, a shift is made to a Y'Z plane. The Y-axis as defined here means a true Y-axis as projected on the X-cut substrate plane. With respect to the X'-axis shifted from the X-axis, and axis Y" as obtained by projecting the corresponding Y'-axis on the plane of the substrate 11 is expressed as the true Y axis.

Figure 3:
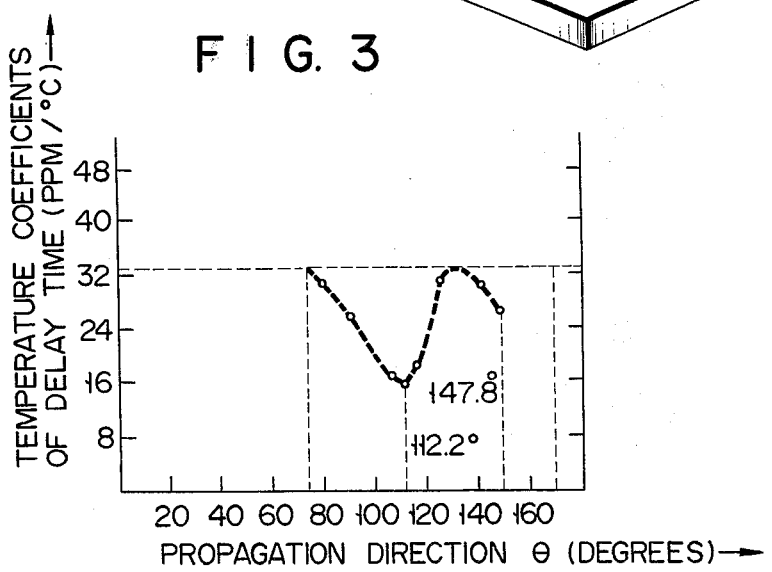
FIG. 3 is a graph showing the relation of the surface wave propagation direction in the embodiment in FIG. 1 to a temperature coefficient of the delay time in the elastic surface wave device.

FIG. 3 is a characteristic curve based on experiments, showing the relation of the temperature coefficient of the delay time to the propagation direction (i.e., the surface wave propagation direction $\theta$ being the angle of line 17 relative to the Y-axis) of an elastic surface wave on the X-cut LiTaO$_3$ substrate 11.

As is seen from FIG. 3 the temperature coefficient shows minimal values when the surface wave propagation direction is at 112.2° (see FIG. 1) and 147.8° from the Y-axis. From the curve in FIG. 3 it has been found that when an elastic surface wave is propagated in a direction $\theta$ of 112.2° and 147.8° from the Y-axis, an elastic surface wave device can be obtained having a good temperature characteristics.

Figure 4:
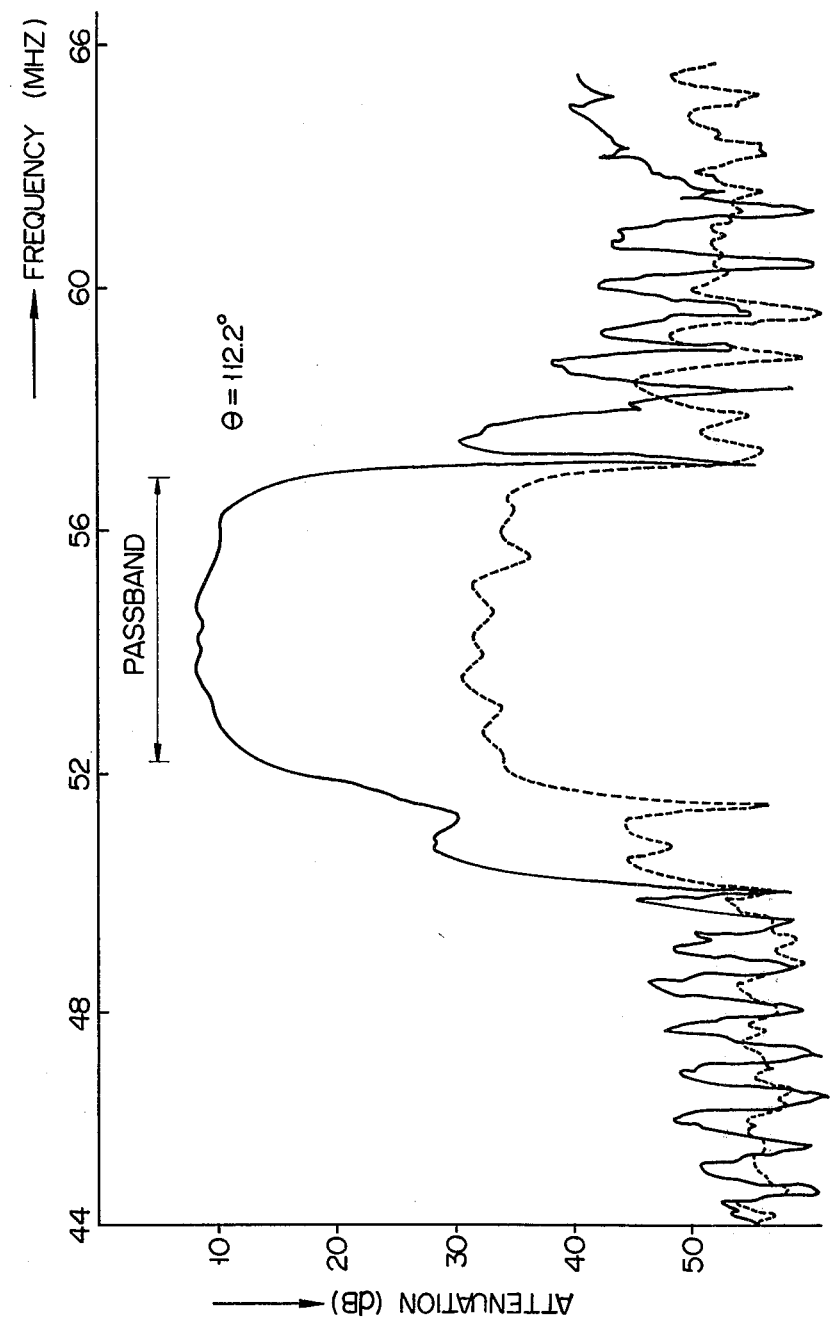
FIG. 4 shows the frequency characteristic curve for the elastic surface wave device of FIG. 1.

FIG. 1 shows an elastic surface wave device set at the surface wave propagation direction of 112.2° at which the temperature coefficient is small. Upon measurement of the frequency characteristic an excellent result as shown in FIG. 4 was obtained. In this case, the surface wave propagation direction ($\theta = 112.2°$) means that an elastic surface wave is propagated from the interdigital electrode pair 12 to the interdigital electrode pair 13. The same result is also obtained when a surface wave is propagated from the interdigital electrode pair 13 to the interdigital electrode pair 12. In this case, the propagation direction is $\theta = 112.2° + 180° = 292.2°$. The solid curve in FIG. 4 is a plot of the level of the electrical signal appearing on the interdigital electrode pair 13 when a 44 to 66 MHz frequency signal is applied to the interdigital electrode pair 12 on the elastic surface wave device shown in FIG. 1. The elastic surface wave device has a passband of from about 52 to about 57 MHz with an attenuation region existing outside the passband. It will be seen from the curve in FIG. 4 that the spurious waves in the attenuation region are small, and are within practical limits. The dotted line curve in FIG. 4 shows the frequency characteristic when a surface wave attenuating material is placed in a small amount on the surface wave propagation path extending from the interdigital electrode pair 12 to the interdigital electrode pair 13. It is conceivable that in view of the fact that response is substantially equally attenuated by only surface wave attenuation method within and outside the passband, the response outside the passband as well as the response within the passband is mainly responsible for the response characteristic of the surface wave. It is thus seen that the embodiment in FIG. 1 has not only a small temperature coefficient, but a good bulk spurious response characteristic.

FIGS. 5 to 10 show the frequency characteristics when the surface wave propagation direction $\theta$ is variously varied in a practical range such that the temperature coefficient (FIG. 3) is maintained, for example, below about 34 PPM/°C. It is to be noted that, as explained in FIG. 4, the same result is obtained if the angle $\theta + 130°$ from the Y-axis is used instead of the angle $\theta$. The following explanation, however, is restricted for convenience to the angle $\theta$ only. Similar explanations apply for angles of $\theta + 180°$.

Figure 5:
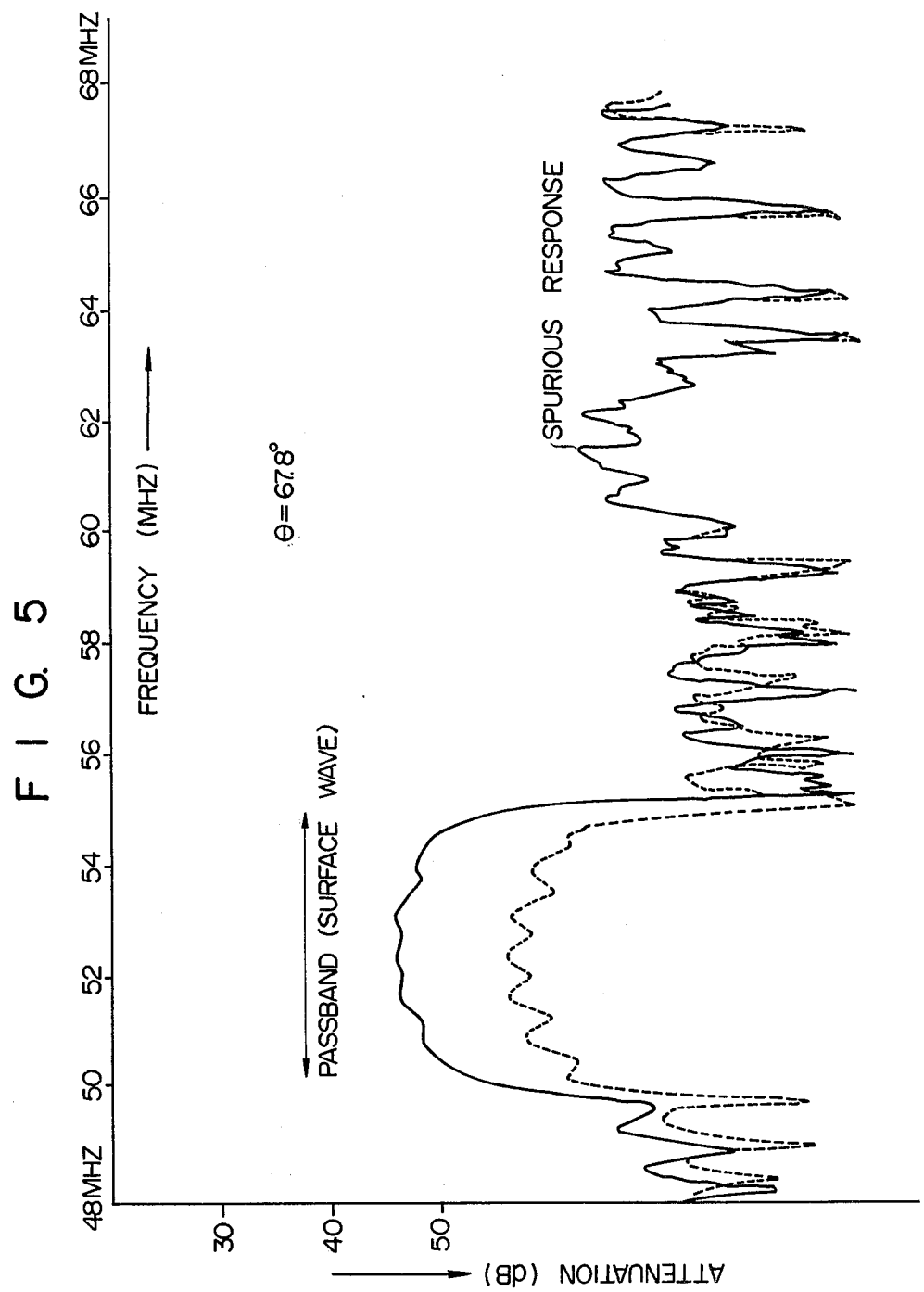
FIGS. 5 to 10 each show the relation of a frequency to the amount of attenuation for different surface wave propagation directions.

At $\theta = 67.8°$ the frequency characteristic of the surface wave device is plotted as the solid line in FIG. 5, and the dotted line shows the frequency characteristic when a small amount of surface wave attenuating material is placed on the surface wave propagating path. As the attenuating material use may be made of, for example, a rubber-like adhesive commercially available under the trade name of "Cemedine Contact." The attenuating material is coated by a fine cotton-clad rod. When the frequency is continuously varied from 48 MHz to 68 MHz the attenuation is such that a passband is present in the range of from about 50 to about 55 MHz at below about 50 dB. If in this case a surface wave absorbing material is coated between the electrode pairs 12 and 13 to attenuate the surface wave to a small extent, a characteristic as shown in dotted lines in FIG. 5 is obtained and a spurious wave response resulting from the bulk wave is present at −20 dB. At $\theta = 67.8°$ it has been found that the elastic surface wave device has a poor spurious response characteristic irrespective of the fact that the temperature coefficient of the delay time is a sufficiently small value for practical purposes.

Figure 6:
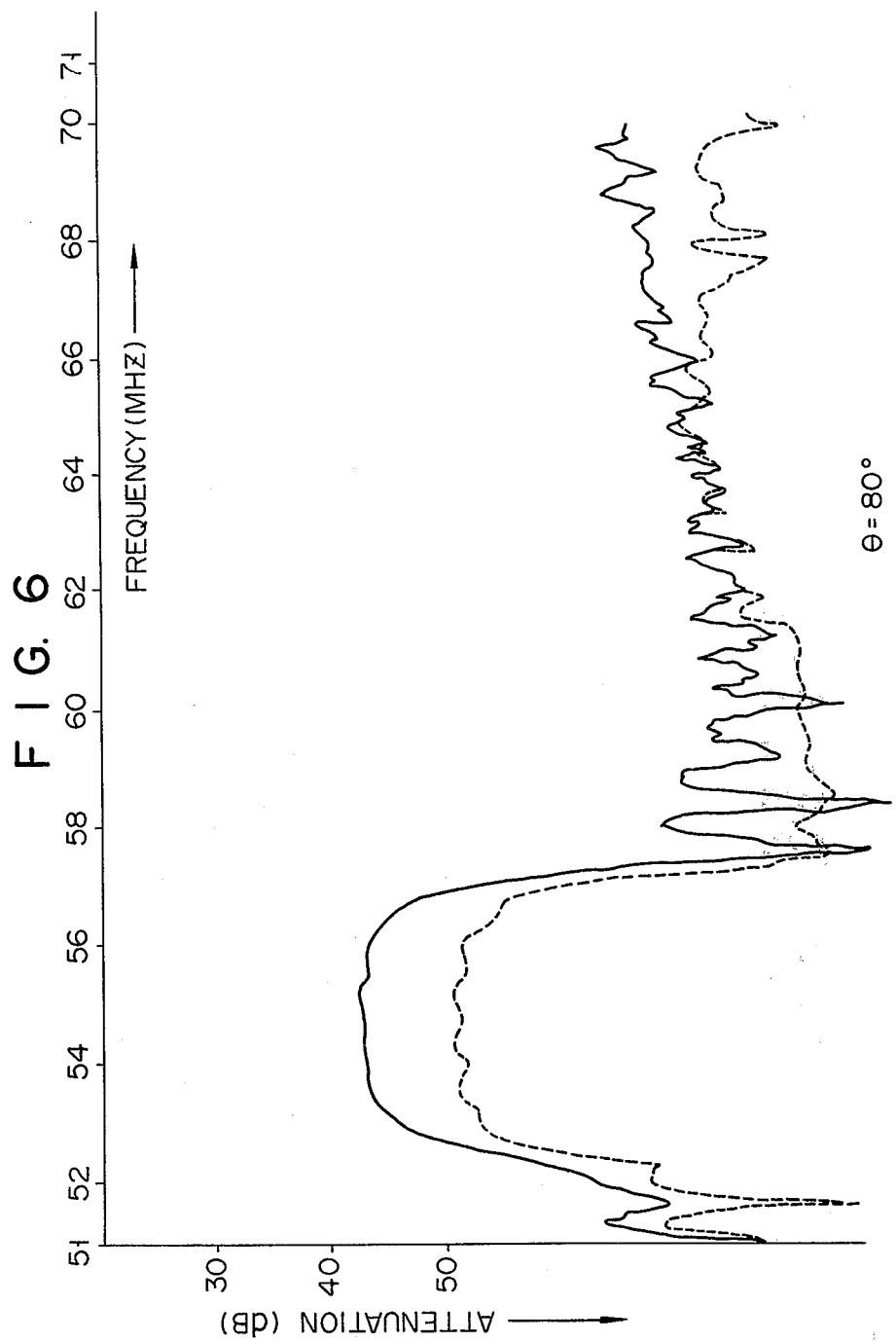

FIG. 6 shows the frequency characteristics of the device when the angle $\theta = 80°$. When the frequency is continuously varied in the range of from 51 to 70 MHz, the attenuation is such that a passband is present in a range of from about 53 to about 57 MHz below about 50 dB, and a spurious response is seen to be 30 dB down over this range. The dotted lines indicate the frequency response when the surface wave is attenuated to a small extent. It is seen from FIGS. 5 and 6 that at $\theta = 80°$ an elastic surface wave device having a better attenuation characteristic is obtained than at $\theta = 67.8°$.

Figure 7:
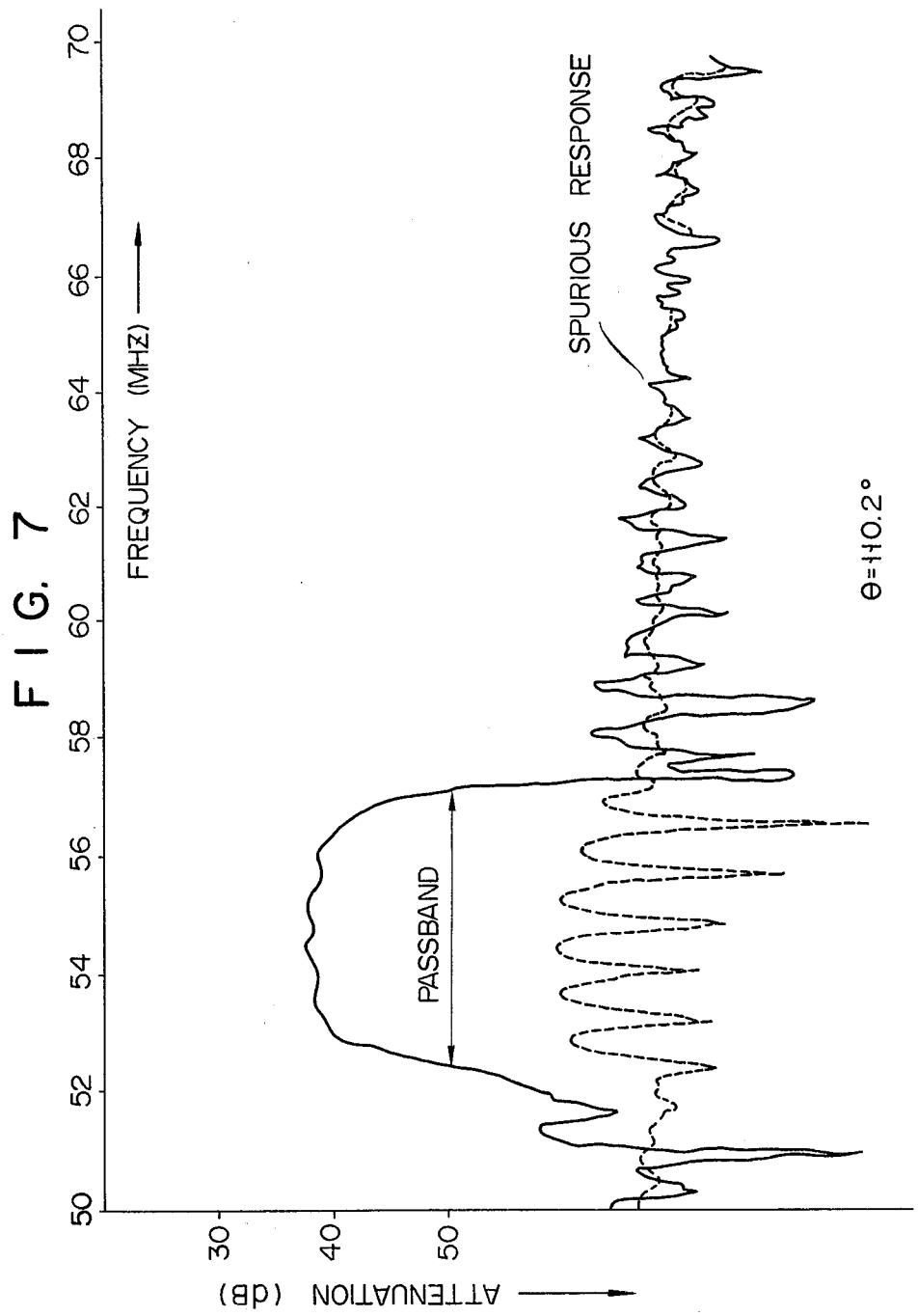

FIG. 7 shows the frequency characteristic of the surface wave and bulk wave when the angle $\theta = 110.2°$. When the frequency is continuously varied in the range of from 51 to 70 MHz, the surface wave attenuation is such that a passband is present in the range of from about 53 to about 57 MHz below 50 dB, and the spurious response is sufficiently small. The level of the bulk spurious wave response is present below −30 dB from the surface wave response. It is thus seen that an elastic surface wave device having a better characteristic is obtained when the angle $\theta = 110.2°$.

Figure 8:
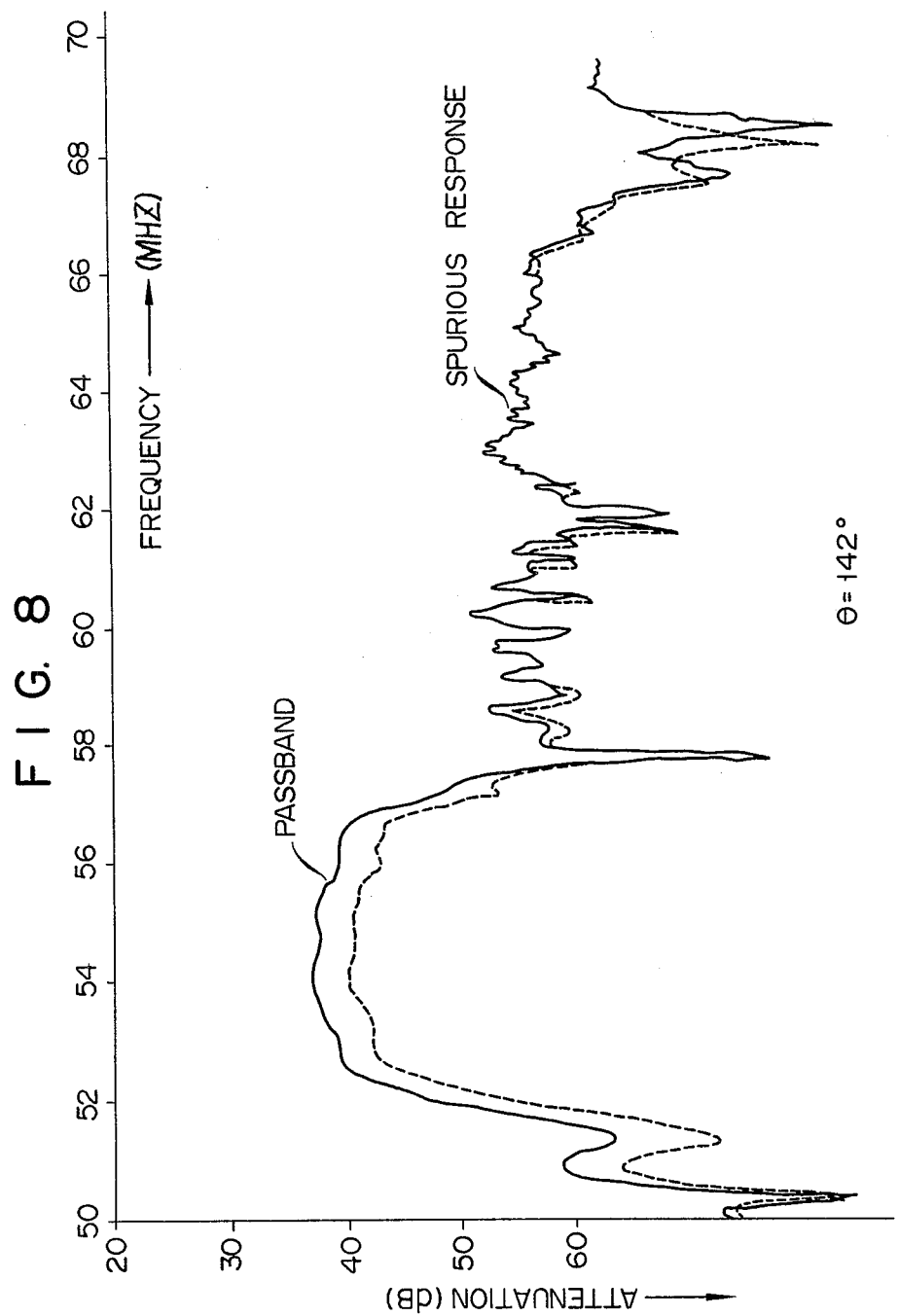

FIG. 8 shows the frequency characteristics of the device when the angle $\theta = 142°$. The attenuation of the surface wave, if continuously varied in the range of from 50 to 70 MHz, is such that a passband is present in the range of from about 52 to about 57 MHz below about 50 dB. The characteristic curve as indicated in dotted lines in FIG. 8 is obtained by attenuating the surface wave as aforementioned and indicates that a response portion entirely free from any influence of the surface wave absorbing member exists at the high frequency side immediately near the passband. That is, on the high frequency side of the passband, the spurious response is high. As viewed from the standpoint of the frequency characteristic, the spurious response is unpractically increased at an angle $\theta$ of 142°. As $\theta$ is increased above 142°, the spurious response is also too high.

Figure 9:
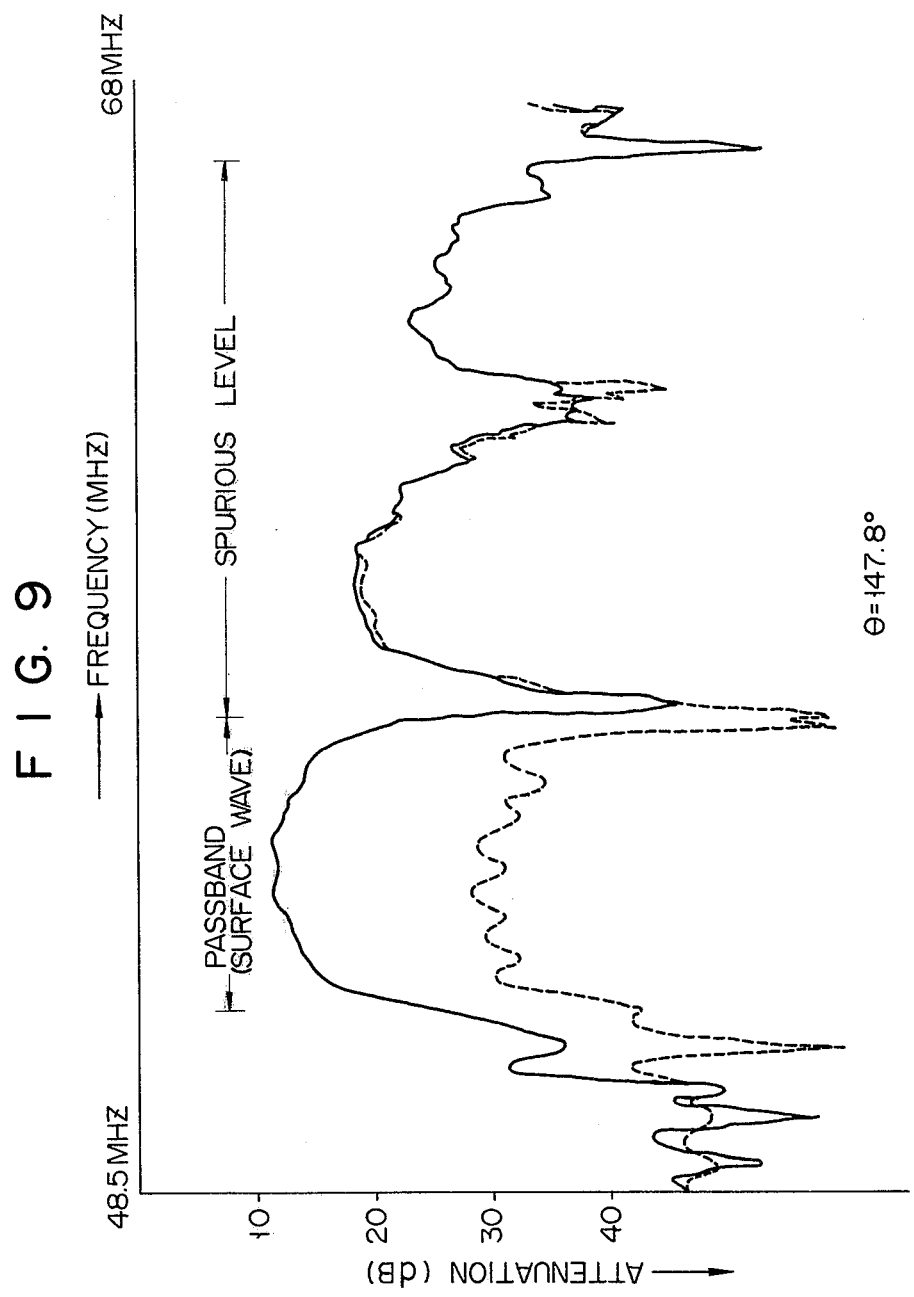
Figure 10:
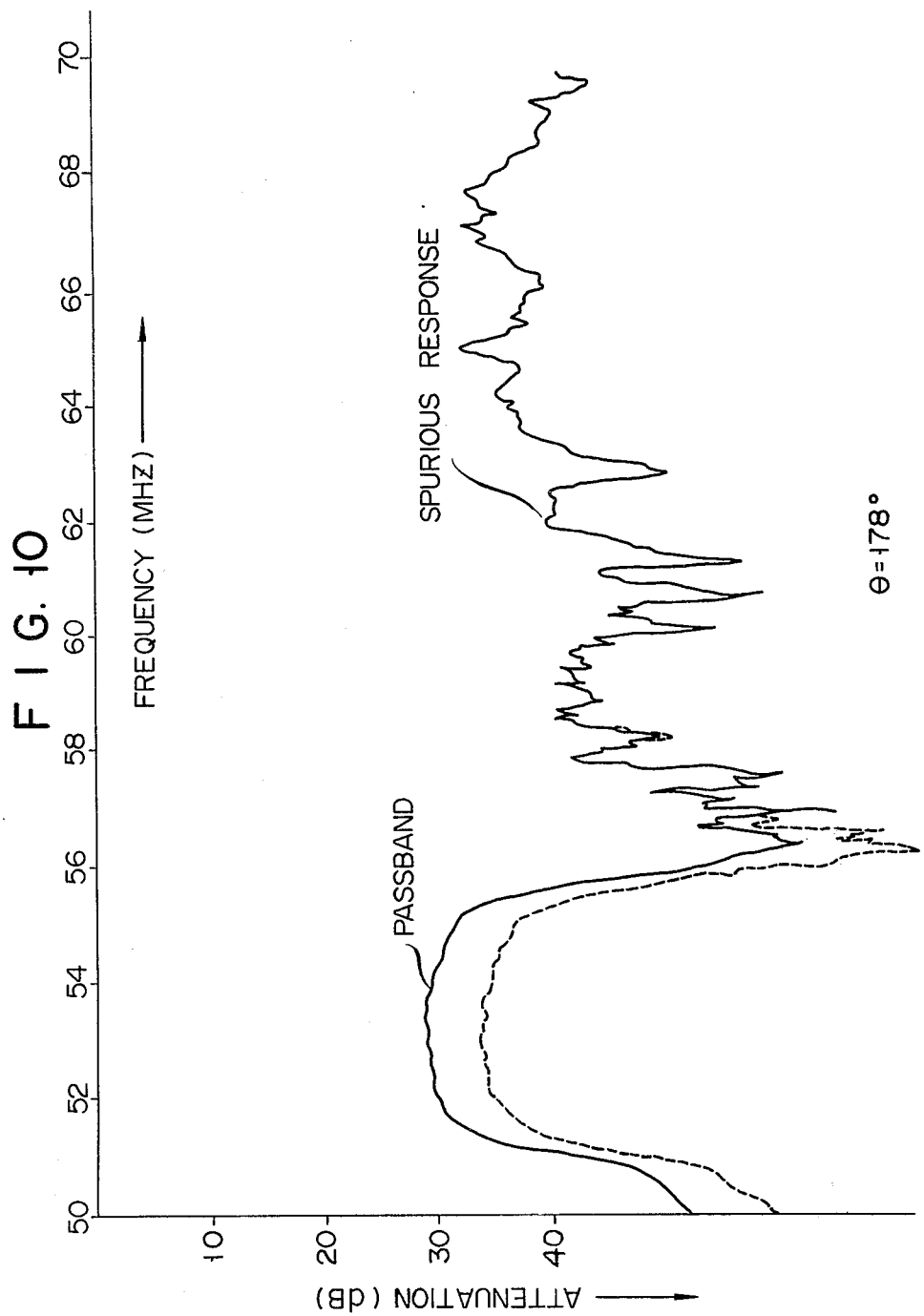

The increase in spurious response for $\theta$ greater than 142° is more evident from the frequency characteristic curves as shown in FIGS. 9 and 10. FIG. 9 shows the case where $\theta = 147.8°$ and FIG. 10 $\theta = 178°$. In either case the bulk wave spurious response is excessively increased at the high frequency side of the surface wave response, thus preventing practical use as an elastic surface wave device.

FIG. 11 is a graphical representation showing the frequency characteristic of a surface wave device as obtained from a combination of FIGS. 4 to 10 with the surface wave propagation direction $\theta$ as the abscissa and the bulk spurious response level (relative level with respect to the passband level) as the ordinate. The range of propagation direction $\theta$ for relative spurious levels less than 40 dB is found upon examination of FIG. 11 to be from about 75° to about 133°. If the propagation direction $\theta$ is selected within this range it will be possible to obtain an elastic surface wave device having a better frequency characteristic (spurious wave prevention characteristic). The same result can also be obtained at $\theta = 75° + 180°$ to $\theta = 133° + 180°$.

With $75° < \theta < 133°$ the temperature characteristic of the delay time is a sufficiently low value as shown in FIG. 3, a value below 34 PPM/C.°, at which a better characteristic is obtained from a practical viewpoint.

FIG. 12 is a graph showing the relation of the piezoelectric coupling efficiency of the surface wave device to the propagation direction $\theta$ on the X-cut LiTaO$_3$ substrate. The coupling coefficient is in a maximal range for $\theta$ between about 72° and 140°. The range $72° < \theta < 140°$ to achieve maximal coupling efficiency substantially agrees with the angle range $75° < \theta < 133°$ as viewed from the standpoint of the frequency characteristic (FIG. 11). It will be appreciated that by selecting the angle $\theta$ in the range of $75° < \theta < 133°$ an elastic surface wave device can be obtained having a better spurious response characteristic, temperature characteristic and coupling coefficient (i.e., coupling efficiency) characteristic.

FIG. 13 is a graph showing the temperature drift characteristic of the central frequency as a passband (54.6 to 54.7 MHz) of an intermediate frequency (IF) filter for a color TV receiver which is constructed of an elastic surface wave device with the angle $\theta$ selected at $\theta = 112.2°$ as shown in FIG. 1. As will be seen from FIG. 13, even if the temperature is varied in a range of $-20°$ to $80°$ C., the central frequency varies in a range of about $\pm 0.38$ MHz and an excellent temperature drift characteristic will be obtained.

In the illustrated example of FIG. 1, typical dimensions of the device, as indicated in FIGS. 1 and 2, are as follows:

s = 1.2 mm
l = 15 mm
w = 2.5 mm
t = 0.37 mm where s is the interdigital electrode spacing;
l is the length of the cut device;
w is the width of the cut device; and
t is the thickness of the device.

According to this invention, in an elastic surface wave device, an elastic surface wave is propagated in a direction of $75° < \theta < 133°$ and $(75 + 180)° < \theta < (133 + 180)°$ to the Y-axis on the X-cut LiTaO$_3$ substrate and an excellent high-performance elastic surface wave device can be obtained having a high piezoelectric coupling coefficient, small temperature drift of the surface wave central frequency, low spurious response and small temperature coefficient of the delay time.

For background information concerning the subject matter to which the present invention pertains, reference is made to "Physical Acoustics," Edited by Warren P. Mason, Volume 1-Part A, 1964, Academic Press and to "Design Of Resonant Piezoelectric Devices," Richard Holland and E. P. EerNisse, Research Monograph No. 56, The M.I.T. Press, 1969, the contents of which is incorporated herein in their entirety.

While the invention has been described above with respect to a specific embodiment, it should be clear that various modifications and alterations can be arrived at within the scope of the inventive concept as set forth in the appended claims.

We claim:

1. An intermediate frequency filter for television receivers having a passband of less than about 5 MHz, improved temperature stability and improved adjacent channel spurious response suppression, including an elastic surface wave device comprising:
   at least one transducer having an elastic surface wave propagated in a direction of $(112° \pm 10°)$ or $(112° \pm 180° \pm 10°)$ to a Y-axis on an X-cut lithium tantalate (LiTaO$_3$) substrate, in which said LiTaO$_3$ crystal is vertically X-cut at an angle of $\pm 10°$ from the substrate based on the IRE standard and said Y-axis based on the IRE standard is an axis projected on the X-cut substrate;
   a pair of spaced apart signal electrodes on said substrate and aligned in said propagation direction, an elastic surface wave propagating in said transducer from one of said electrodes to the other responsive to an applied signal; and
   said transducer having dimensions such that the passband width of the filter is less than about 5 MHz.

2. An intermediate frequency filter according to claim 1 having an elastic surface wave propagation direction of about 112.2° to the Y-axis of said X-cut lithium tantalate substrate.

3. An intermediate frequency filter according to claim 1 wherein said elastic surface wave propagation direction is within a range of from 110.2° to 112.2°.

4. An intermediate frequency filter according to claim 1 having an elastic surface wave propagation direction of about 292.2° to the Y-axis of said X-cut lithium tantalate substrate.

5. An intermediate frequency filter according to claim 1 wherein said elastic surface wave propagation direction is within a range of from 290.2° to 292.2°.

6. An intermediate frequency filter wave according to claim 1 wherein said electrodes comprise interdigital electrodes.

7. An intermediate frequency filter according to claim 6 wherein said interdigital electrodes comprise a plurality of elongate digit electrodes oriented substantially perpendicularly to said propagation direction.

* * * * *